(12) United States Patent
Ehrenpfordt et al.

(10) Patent No.: US 9,517,928 B2
(45) Date of Patent: Dec. 13, 2016

(54) MICROMECHANICAL FUNCTIONAL APPARATUS, PARTICULARLY A LOUDSPEAKER APPARATUS, AND APPROPRIATE METHOD OF MANUFACTURE

(71) Applicant: Robert Bosch GmbH, Stuttgart (DE)

(72) Inventors: Ricardo Ehrenpfordt, Korntal-Muenchingen (DE); Mathias Bruendel, Stuttgart (DE); Andre Gerlach, Leonberg-Hoefingen (DE); Christina Leinenbach, Karlsruhe (DE); Sonja Knies, Rutesheim (DE); Ando Feyh, Palo Alto, CA (US); Ulrike Scholz, Korntal (DE)

(73) Assignee: Robert Bosch GmbH, Stuttgart (DE)

( * ) Notice: Subject to any disclaimer, the term of this patent is extended or adjusted under 35 U.S.C. 154(b) by 909 days.

(21) Appl. No.: 13/650,495

(22) Filed: Oct. 12, 2012

(65) Prior Publication Data
US 2013/0094684 A1 Apr. 18, 2013

(30) Foreign Application Priority Data
Oct. 13, 2011 (DE) .......................... 10 2011 084 393

(51) Int. Cl.
*B81C 1/00* (2006.01)
*H04R 19/00* (2006.01)
*H04R 31/00* (2006.01)

(52) U.S. Cl.
CPC ........... *B81C 1/0023* (2013.01); *H04R 19/005* (2013.01); *B81B 2201/0257* (2013.01); *H04R 31/006* (2013.01); *Y10T 29/4913* (2015.01)

(58) Field of Classification Search
CPC . H04R 19/00; H04R 19/005; H04R 2201/003; H04R 31/006; B81B 3/0062; B81B 2201/0257; B81C 1/0023; Y10T 29/4913
(Continued)

(56) References Cited

U.S. PATENT DOCUMENTS

| 6,732,588 B1 * | 5/2004 | Mullenborn .......... G01L 9/0073 361/761 |
|---|---|---|
| 7,763,972 B2 * | 7/2010 | Chien ................... B81B 7/0061 257/666 |

(Continued)

FOREIGN PATENT DOCUMENTS

DE    10 2005 055 478 A1    5/2007

*Primary Examiner* — Davetta W Goins
*Assistant Examiner* — Oyesola C Ojo
(74) *Attorney, Agent, or Firm* — Maginot, Moore & Beck LLP

(57) ABSTRACT

A micromechanical functional apparatus, particularly a loudspeaker apparatus, includes a substrate, at least one circuit chip mounted on the substrate, and an enveloping package in which the circuit chip is packaged. The functional apparatus further includes a micromechanical functional arrangement, particularly a loudspeaker arrangement having a plurality of micromechanical loudspeakers, which is mounted on the enveloping package. A covering device is mounted above the micromechanical functional arrangement, particularly the loudspeaker arrangement, opposite the enveloping package. A method is implemented to manufacture the micromechanical functional apparatus.

10 Claims, 2 Drawing Sheets

(58) Field of Classification Search
USPC .......................................... 257/254; 381/386
See application file for complete search history.

(56) References Cited

U.S. PATENT DOCUMENTS

| | | | |
|---|---|---|---|
| 8,188,557 B2 * | 5/2012 | Rombach et al. ............ | 257/416 |
| 2007/0194430 A1 * | 8/2007 | Lin ..................... | H01L 23/3121 |
| | | | 257/690 |
| 2008/0135939 A1 * | 6/2008 | Lin ..................... | H01L 21/4821 |
| | | | 257/355 |
| 2010/0052082 A1 * | 3/2010 | Lee ...................... | B81B 7/0061 |
| | | | 257/416 |

\* cited by examiner

MICROMECHANICAL FUNCTIONAL APPARATUS, PARTICULARLY A LOUDSPEAKER APPARATUS, AND APPROPRIATE METHOD OF MANUFACTURE

This application claims priority under 35 U.S.C. §119 to patent application no. DE 10 2011 084 393.0, filed on Oct. 13, 2011 in Germany, the disclosure of which is incorporated herein by reference in its entirety.

BACKGROUND

The disclosure relates to a micromechanical functional apparatus, particularly a loudspeaker apparatus, and to an appropriate method of manufacture.

Although it is actually possible to use any micromechanical functional apparatuses, the present disclosure and the underlying problems are explained with reference to silicon-based micromechanical loudspeaker apparatuses.

In comparison with microphone or pressure sensor packages, which need to provide media access to the diaphragm, a front volume and possibly a back volume in a small installation space, a package for MEMS loudspeaker apparatuses should provide a suitable acoustic window, in particular.

MEMS-based loudspeakers usually consist of a relatively large MEMS chip which has an arrangement of individual loudspeakers having respective diaphragms, wherein the respective diaphragms can be deflected on both sides by adjacently arranged perforated electrodes.

DE 10 2005 055 478 A1 discloses a micromechanical structure for receiving and/or producing acoustic signals in a medium which at least partially surrounds the structure. The structure has a diaphragm which is essentially closed and which essentially forms a first side of the structure, and also a mating element and a closed substrate which is provided on a second side side, which is opposite the first side. The mating element is provided between the diaphragm and the substrate.

SUMMARY

The disclosure provides a micromechanical functional apparatus, particularly a loudspeaker apparatus and an appropriate method of manufacture.

The concept on which the present disclosure is based is the application of a construction and connection technique (packaging) which is based on the embedding of at least one circuit chip in an enveloping compound, particularly a molding compound, on a substrate. The functional arrangement is fitted on the enveloping compound with the embedded circuit chip, and a covering device, e.g. a film, is mounted on the functional arrangement on the side which is opposite the enveloping compound. The resultant design is distinguished in that the elements required can be connected compactly and inexpensively.

The disclosure allows economical integration of the functional arrangement and the evaluation circuit (circuit chip) and possibly further parts that are important to operation, such as passive elements in the form of capacitors, resistors, etc., on a common substrate.

The embedding technologies used may be either methods akin to printed circuit board production or enveloping with filled or unfilled polymer materials, e.g. using casting, injection-molding or transfer-molding methods.

The preferred embodiments involve enveloping the circuit chips with a suitable polymer compound, e.g. molding compound, using a batch process. In combination with the manufacture of conductive structures, large-format substrates are produced which can have components fitted and contact made with them using standard processes with the functional arrangement. Subsequently, the functional arrangement can be covered using a covering device which is permeable to a particular physical variable, e.g. sound or light. The molding process can be used to form cavities or recesses in the enveloping compound which, by way of example, produce the acoustically necessary back volume for the acoustically active area of a respective loudspeaker in an MEMS loudspeaker arrangement, or which supplement a respective back volume which is produced in the MEMS loudspeaker arrangement. This also allows process costs to be saved in the MEMS production of the loudspeaker arrangement.

The following advantages can be achieved by the present disclosure.

Since the circuit chip is fitted beneath the functional arrangement, there is a distinct reduction in the footprint in comparison with a classical side-by-side construction.

When a printed circuit board substrate is used, it is particularly possible to cap the package by laminating on the film using the batch method, which means that it is not necessary to perform a serial capping process (positioning the individual frames and laminating on the film). Singularization is effected by means of a sawing process, for example. This significantly reduces the costs of manufacture.

Since, in the case of an MEMS loudspeaker apparatus, a large portion of the back volume is provided in the package, the chip thickness can be reduced in the case of the MEMS loudspeaker arrangement. This reduces the costs of manufacture of the MEMS loudspeaker arrangement, since the trench process is more expensive with a chip thickness of 400 µm, for example, than with a chip thickness of 200 µm, for example.

Alternatively if the MEMS chip thickness of the loudspeaker arrangement is unaltered, it is possible to enlarge the back volume inexpensively. In addition, a very low physical height is possible with a simultaneously minimum possible footprint, since stacking is possible without the use of spacer chips.

The disclosure can be used for a large number of functional arrangements, e.g. loudspeakers for CE applications (mobile radio applications, PDAs, laptops, etc.), where an extremely inexpensive package is required with a simultaneously low physical height. Further areas of use are microphones, camera chips, infrared sensors, optical sensors and, in general, micromechanical elements with sensitive structures which require a window which is transparent to a particular physical variable.

BRIEF DESCRIPTION OF THE DRAWINGS

Further features and advantages of the present disclosure are explained below using embodiments with reference to the figures, in which.

DETAILED DESCRIPTION

In the figures, the same reference symbols denote elements which are the same or each have the same function.

Figure 1A:
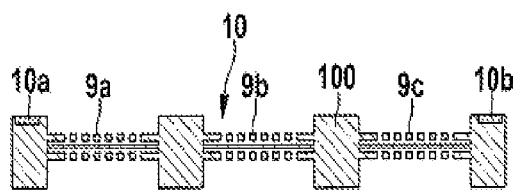
FIGS. 1a) and b) show schematic cross-sectional views to explain a micromechanical loudspeaker apparatus and an appropriate method of manufacture according to a first embodiment of the present disclosure.

FIG. 1a) and b) are schematic cross-sectional views to explain the micromechanical loudspeaker apparatus and an appropriate method of manufacture according to a first embodiment of the present disclosure;

FIG. 1a shows an MEMS loudspeaker arrangement 10 which has a plurality of loudspeakers 9a, 9b, 9c clamped between a respective frame 100. Reference symbols 10a, 10b denote electrical connections of the MEMS loudspeaker arrangement 10.

It should be mentioned that FIG. 1a shows only the cross section from a small detail of such an MEMS loudspeaker arrangement 10 and that actually such a loudspeaker arrangement consists of a large number of between hundreds and thousands of individual loudspeakers.

Figure 1B:
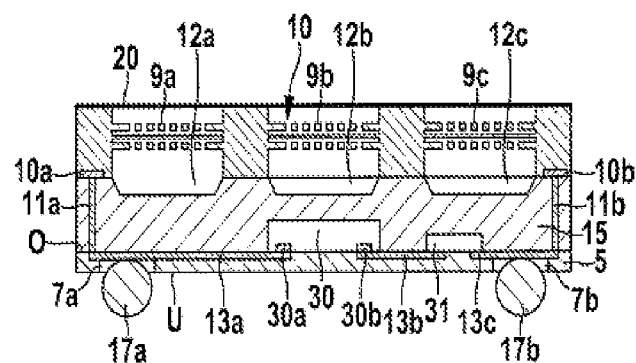

Also with reference to FIG. 1b, the manufacture of the loudspeaker apparatus according to the first embodiment first of all involves the provision of a substrate 5, for example a thin printed circuit board substrate, on the top of which a redistribution device 13a, 13b, 13c is mounted. In addition, the substrate 5 has perforations 7a, 7b which connect the top O of the substrate to the underside U of the substrate, the perforations 7a, 7b containing respective electrical contact-connection devices 17a, 17b, for example solder balls, which can be used to make contact with the loudspeaker apparatus from the underside U.

A circuit chip 30 with connection pads 30a, 30b is then electrically and mechanically connected to the redistribution device 13a, 13b on the top O of the substrate 5. Similarly, a circuit chip 31 having contact pads—not shown—is electrically and mechanically connected to the redistribution device 13b, 13c.

Next, a molding compound 15 is molded around the circuit chips 30, 31 on the top O of the substrate 5, with the cutouts 12a, 12b, 12c being formed on that side of the molding compound 15 which is opposite the substrate and forming back volumes for the loudspeaker arrangement 10.

By electrical plated-through holes 11a, 11b are formed in the molding compound 15 which are electrically connected to the redistribution device 13a or 13c.

The MEMS loudspeaker arrangement 10 is then connected—with the connection areas 10a, 10b pointing downward—to the molding compound 15 such that the cutouts 12a, 12b, 12c form the back volumes of the loudspeakers 9a, 9b, 9c. In the same step, the connection pads 10a, 10b are connected to the plated-through holes 11a, 11b, for example by providing an appropriate electrically conductive adhesive. The frames 100 are also adhesively bonded to the molding compound 15 in order to connect the loudspeaker arrangement 10 to the molding compound 15.

In a final process step, a sound-permeable film 20 is then provided as a covering device for the sound radiation side of the loudspeaker arrangement 10.

The loudspeaker apparatus manufactured in this manner can then be bonded to a further substrate together with other electronic components by means of the electrical contact-connection device 17a, 17b.

Figure 2:
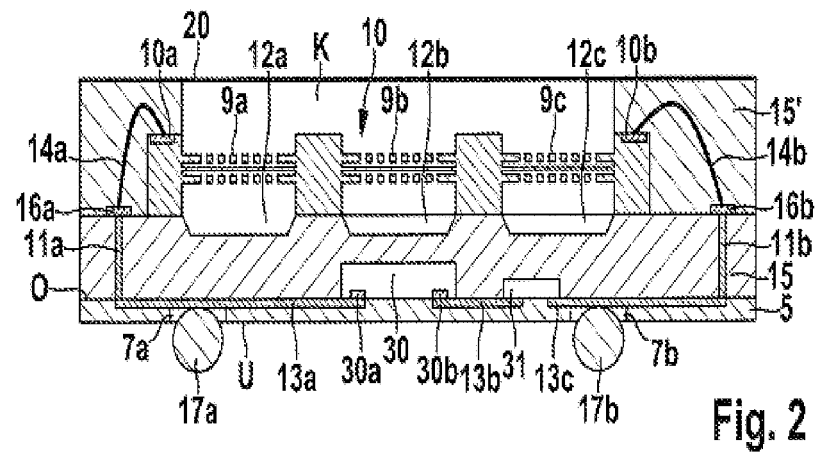
FIG. 2 shows a schematic cross-sectional view to explain a micromechanical loudspeaker apparatus and an appropriate method of manufacture according to a second embodiment of the present disclosure.

FIG. 2 is a schematic cross-sectional view to explain a micromechanical loudspeaker apparatus and an appropriate method of manufacture according to a second embodiment of the present disclosure.

In the case of the second embodiment shown in FIG. 2, the loudspeaker arrangement 10 is fitted to the molding compound 15, for example by means of an appropriate adhesion process, with the electrical connections 10a, 10b pointing upward and away from the molding compound 15. When the plated-through holes 11a, 11b have been produced, bonding pads 16a, 16b are formed on the top of the molding compound 15, which is opposite the substrate 5. The electrical connections 10a, 10b are connected to the bonding pads 16a, 16b by means of bonding wires 14a and 14b.

When the bonding wires 14a, 14b have been bonded, a further molding process takes place in which the bonding wires 14a, 14b and the electrical connections 10a, 10b and also the bonding pads 16a, 16b are completely surrounded by molding.

Above the loudspeaker arrangement 10, the second molding process provides a cavern in the further molding package 15' so that unimpeded radiation of sound is possible. Next, this exemplary embodiment involves the covering device 20 in the form of the film being adhesively bonded to the further molding package 15'.

Figure 3:
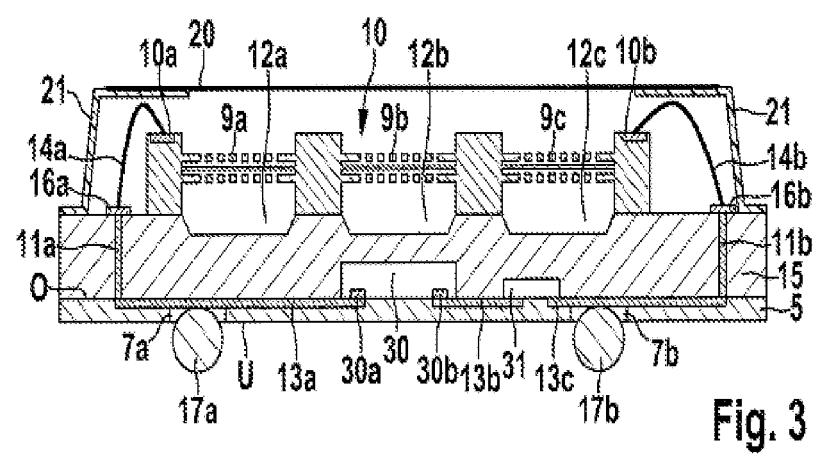
FIG. 3 shows a schematic cross-sectional view to explain a micromechanical loudspeaker apparatus and an appropriate method of manufacture according to a third embodiment of the present disclosure.

FIG. 3 shows a schematic cross-sectional view to explain a micromechanical loudspeaker apparatus and an appropriate method of manufacture according to a third embodiment of the present disclosure.

In the case of the third embodiment, the provision of the bonding wires 14a, 14b between the electrical connections 10a, 10b and the bonding pads 16a and 16b, as already described in connection with FIG. 2, is followed not by the provision of a further molding package but rather by the adhesive bonding of a cap 21 which is open at the top to the molding compound 15. Such a cap 21 may be made from plastic and/or metal, as alternatives. Finally, the covering device 20 in the form of the film 20 is adhesively bonded to the top of the cap.

Although the present disclosure has been described with reference to preferred exemplary embodiments, it is not limited thereto. In particular, the cited materials and topologies are merely exemplary and not limited to the examples which have been explained.

What is claimed is:

1. A method for manufacturing a micromechanical functional apparatus, comprising:
    mounting at least one circuit chip on a substrate;
    then encapsulating the circuit chip mounted on the substrate in an enveloping package;
    then mounting a micromechanical functional arrangement on the enveloping package; and
    then mounting a covering device above the micromechanical functional arrangement opposite the enveloping package; wherein the enveloping package is a molding compound, and wherein: the step of encapsulating the circuit chip includes molding the molding compound around the circuit chip and forming one or more cavities in the molding compound on a side of the molding compound opposite the substrate; and
    the step of mounting a micromechanical functional arrangement includes orienting the arrangement relative to the one or more cavities so that the one or more cavities can serve as back volumes.

2. The method according to claim 1, wherein the functional arrangement is a loudspeaker arrangement having a plurality of loudspeakers, wherein the enveloping package has a plurality of cutouts which corresponds to the plurality of loudspeakers, and wherein the loudspeaker arrangement is mounted on the enveloping package such that the cutouts form respective rear volumes of the loudspeakers.

3. The method according to claim 1, wherein a side of the circuit chip on the substrate holds a redistribution device which is in electrical contact with the circuit chip, and wherein the enveloping package has one or more electrical plated-through holes which electrically connect the redistribution device to appropriate connections of the functional arrangement.

4. The method according to claim 3, wherein the connections of the functional arrangement are bonded directly to the plated-through holes.

5. The method according to claim 3, wherein the connections of the functional arrangement are bonded by respective bonding wires to bonding pads which are provided on the enveloping package in electrical contact with the respective plated-through holes, and wherein the enveloping package holds a further enveloping package in which the bonding wires and bonding pads are packaged.

6. The method according to claim 1, wherein the micromechanical functional apparatus is a loudspeaker apparatus, and wherein the micromechanical functional arrangement is a loudspeaker arrangement having a plurality of micromechanical loudspeakers.

7. The method according to claim 1 in which the components are provided in the sequence substrate, circuit chip, molding compound and micromechanical functional arrangement.

8. A micromechanical functional apparatus manufactured according to the method of claim 1.

9. A micromechanical functional apparatus manufactured according to the method of claim 6.

10. A micromechanical functional apparatus manufactured according to the method of claim 1.

* * * * *